United States Patent

Moore et al.

Patent Number: 6,035,186
Date of Patent: *Mar. 7, 2000

[54] INTEGRATED RECEIVER

[75] Inventors: Paul A. Moore, Seaford; Michael E. Barnard, Red Hill, both of United Kingdom

[73] Assignee: U.S. Philips Corporation, New York, N.Y.

[*] Notice: This patent issued on a continued prosecution application filed under 37 CFR 1.53(d), and is subject to the twenty year patent term provisions of 35 U.S.C. 154(a)(2).

[21] Appl. No.: 08/815,099

[22] Filed: Mar. 11, 1997

[30] Foreign Application Priority Data

Mar. 19, 1996 [GB] United Kingdom .................... 9605719

[51] Int. Cl.[7] ....................................................... H04B 1/26
[52] U.S. Cl. ........................ 455/313; 455/234.2; 455/303; 375/346; 375/344
[58] Field of Search .................................... 455/106, 302, 455/304, 306, 100, 73, 89, 247, 234, 303, 296, 356, 324, 316, 234.1, 307; 375/229, 346, 262, 334, 344

[56] References Cited

U.S. PATENT DOCUMENTS

| | | | |
|---|---|---|---|
| 4,573,170 | 2/1986 | Melvin, Jr. et al. | 455/303 |
| 4,599,732 | 7/1986 | LeFever | 375/346 |
| 4,864,643 | 9/1989 | French et al. | 455/103 |
| 4,944,025 | 7/1990 | Gehring et al. | 455/207 |
| 4,947,409 | 8/1990 | Raith et al. | 455/256 |
| 5,187,809 | 2/1993 | Rich et al. | 455/234.2 |
| 5,345,452 | 9/1994 | Matui | 371/41 |
| 5,513,215 | 4/1996 | Marchetto et al. | 375/229 |
| 5,697,093 | 12/1997 | Cusdin et al. | 455/324 |

FOREIGN PATENT DOCUMENTS 1174710  12/1969  United Kingdom ............. H03H 7/02

OTHER PUBLICATIONS

"The Gyrator as a Monolithic Circuit in Electronic System", J.O. Voorman, Catholic University of Nijmegen, The Netherlands, Jun. 16, 1977, pageas 91 to 103.

*Primary Examiner*—Reinhard J. Eisenzopf
*Assistant Examiner*—Greta J. Fuller
*Attorney, Agent, or Firm*—Dicran Halajian

[57] ABSTRACT

An integrated receiver in which in order to permit ac-coupling between stages and to remove the effects of strong directly detected amplitude modulated interfering signals lying within the input band of the receiver, the input signal is frequency down converted using a local oscillator signal which provides an intermediate frequency ($F_{if}$) which lies above the frequency of the directly detected interferer ($F_{AMP}$). The outputs from the frequency down converters (14, 16, 18, 20) are ac coupled to filtering means the outputs of which are applied to an equalizer (52). The filtering means may comprise a polyphase filter (50), the frequency response of which is distorted by the ac coupling capacitors (54, 56). By applying the outputs of the filtering means to the equalizer (52) substantially all the distortion introduced by the ac coupling capacitors (54, 56) on the filter response is removed to provide an acceptable signal for detection and recovery of the modulating signal.

10 Claims, 5 Drawing Sheets

INTEGRATED RECEIVER

FIELD OF THE INVENTION

The present invention relates to an integrated receiver having particular, but not exclusive, application in cellular and cordless telephony, paging and other applications requiring integrated receivers such as frequency analysers.

BACKGROUND OF THE INVENTION

A typical architecture for an integrated receiver is a zero IF(ZIF) architecture in which a received signal is split into two paths and applied to respective mixers to which are applied a local oscillator signal having a frequency of such a value as to frequency down convert the received signal to a ZIF, A relative phase shift of approximately 90° exists between the local oscillator signals applied to the respective mixers. The signal path from one of the mixers is designated an in-phase or I channel and that from the other of the mixers is designated as a quadrature or Q channel. The products of mixing in the I and Q channels are low pass filtered to derive the difference components which are thereafter demodulated.

A well known problem with ZIF receivers is that of dc offsets, which occur due to the various stages, are directly coupled. Other problems occur due to some of the wanted products of mixing being at dc or close to it. The occurrence of dc offsets within the various stages leads to severe desensitizing the receiver circuit which inhibits direct coupling of these stages. Techniques for avoiding the effects of dc offsets include providing ac coupling circuits or more sophisticated dc blocking circuits between successive stages. Inevitably this can lead to loss of some of the wanted products of mixing. In the art, what is termed a notch is created in the frequency response on or about the ZIF. The width of the notch is typically a function of the capacitance value used in the ac coupling circuits. Thus to minimise the width of the notch, a high value capacitance is used. However the higher the value of capacitance the longer the ac-coupling time constant which in turn places a limit on the speed with which the receiver can recover from a change in dc offset caused by amplitude modulated or pulsed interfering signals. While the ac-coupling time constant can be reduced by using a lower value of capacitance, this causes the width of the notch to be greater thereby eliminating more of the wanted signals.

U.S. Pat. No. 4,944,025 discloses a direct conversion FM receiver that includes ac-coupling and automatic gain control. The receiver receives a signal at a radio frequency, frequency down converts the received signal and filters the signal which is subsequently frequency up-converted and then demodulated. The frequency-down conversion, filtering and up-conversion is done using quadrature related mixers the respective outputs of which are successively ac-coupled to an amplifier, a low pass filter and a mixer. In order to overcome the problem of the notch in the frequency spectrum due to ac-coupling, the local oscillator frequency supplied in quadrature to the frequency down-converting mixers is offset from the nominal carrier frequency of the received signal by the sum of the width of the notch plus the base bandwidth of the modulated signals. In a numerical example the offset corresponds to about a quarter of the channel spacing. The bandwidth of the low pass filters is such as to pass the band of the wanted signals but block signals on adjacent channels. Although the invention disclosed in U.S. Pat. No. 4,944,025 goes some way to mitigating the problem due to the notch created by ac coupling, there are nevertheless constraints on the choice of value of the ac-coupling capacitors because if it is relaxed too far, inadequate image rejection occurs because as the offset frequency, which is a function of the size of the notch, increases the adjacent channel signals will be closer in frequency to the wanted signals and will be more difficult to separate by simple filtering.

Another problem which occurs with direct conversion receivers, and is not considered by U.S. Pat. No. 4,944,025 is that of the presence of strong amplitude modulated signals in the rf signal bandwidth, which signals are directly detected and appear in the ZIF band and cannot be removed by filtering.

It is an object of the present invention to be able to relax the ac-coupling constraints in an integrated direct conversion receiver.

According to the present invention there is provided a receiver comprising means for frequency down-converting a received signal to produce quadrature related i.f. signals at a frequency offset from d.c, means for blocking dc-offsets in the quadrature related i.f. signals, means for recovering the wanted i.f. signals and means for equalising the wanted i.f. signals and detecting modulating signals present in the i.f. signals.

The present invention is based on the realisation that the signal equaliser will attempt to overcome all the distortion occurring in the path of the signal from the point when it leaves the transmitter until it enters the equaliser. Hence it is possible to increase the width of the notch by using a low value capacitor and thereby reducing the effect of the ac coupling time constant on the recovery of the receiver from a change in dc offset caused by amplitude or pulsed interfering signals while recovering the modulating signal substantially undistorted.

The receiver may have various architectures such as a phasing receiver or a polyphase receiver.

The amount of the frequency offset may be chosen to place any known interfering signals at one edge of, or beyond, the bandwidth of the wanted signals.

In an embodiment of the present invention the means for recovering the wanted i.f. signals comprises polyphase filtering means, which may be implemented as gyrator filtering means or as transconductor integrator filtering means, and which is able to provide a complex output signal in response to a complex input signal and can effectively filter out the image of the wanted signal.

The present invention will now be described, by way of example, with reference to the accompanying drawings, wherein.

Figure 3:
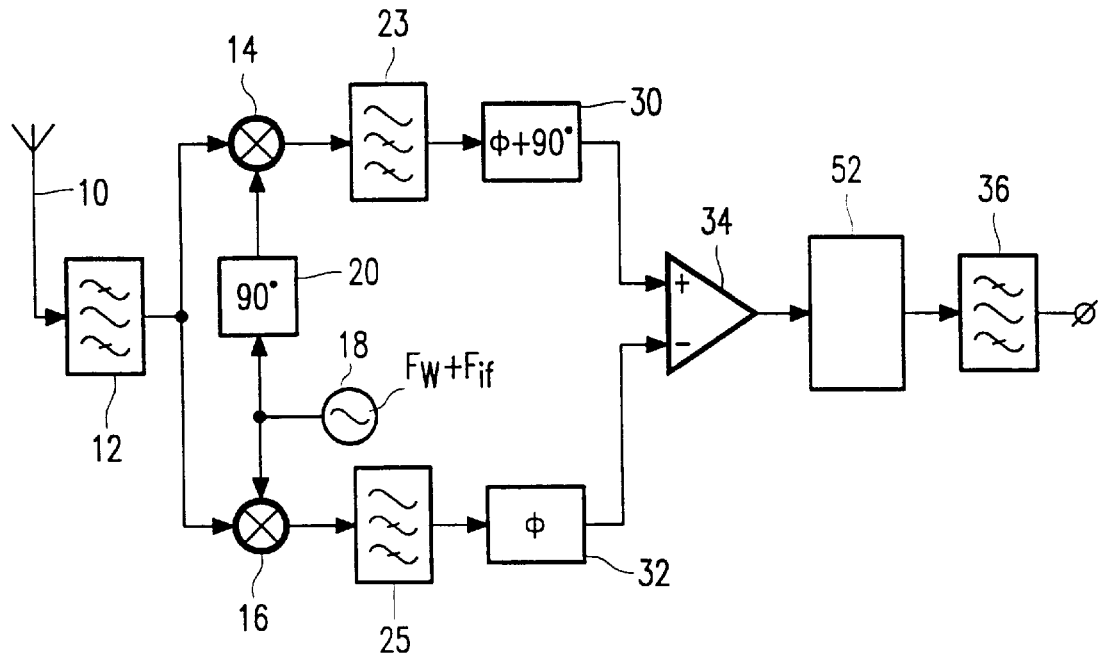
Figure 4:
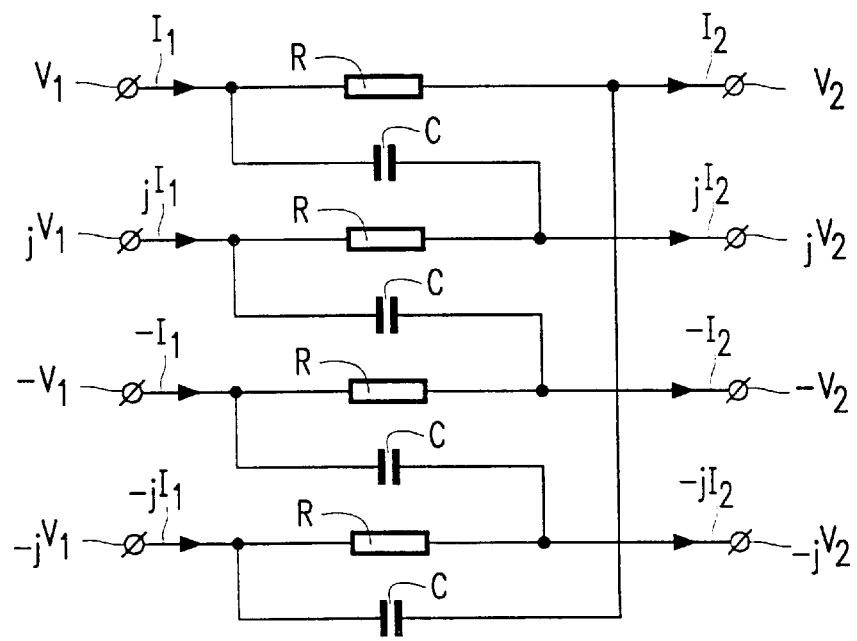
Figure 5:
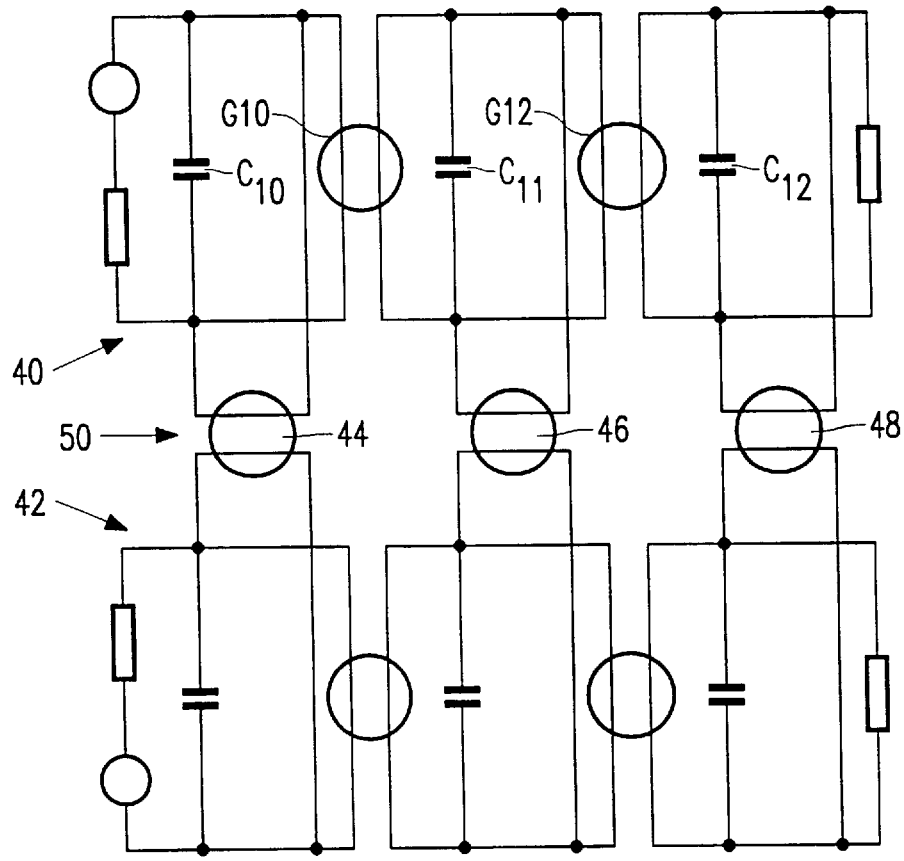
Figure 6:
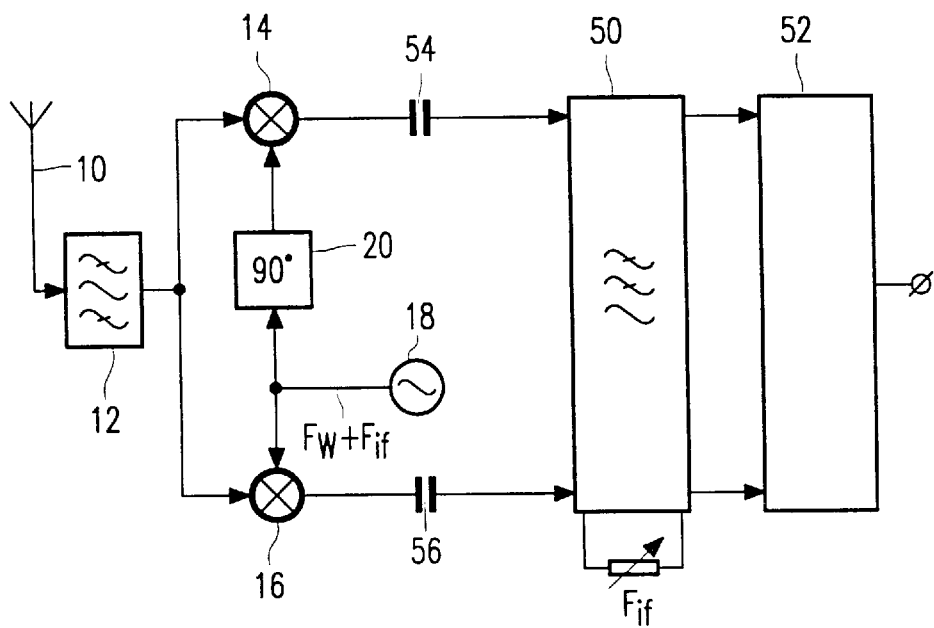
Figure 7A:
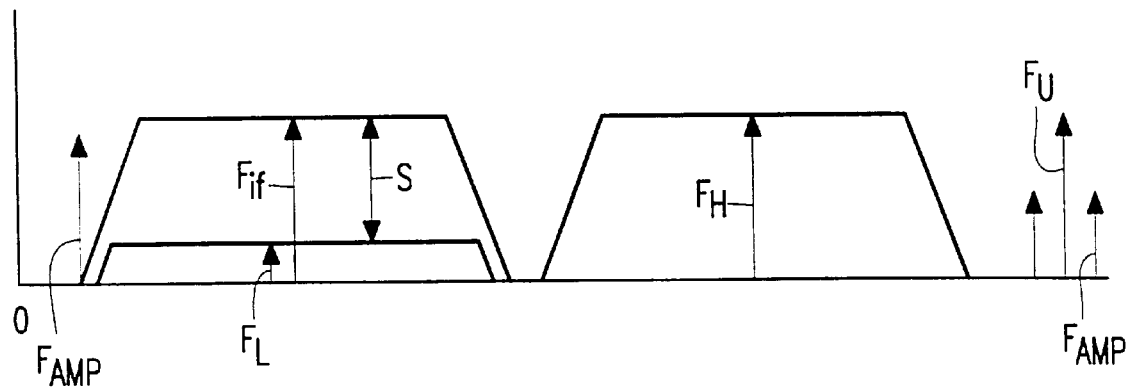
Figure 7B:
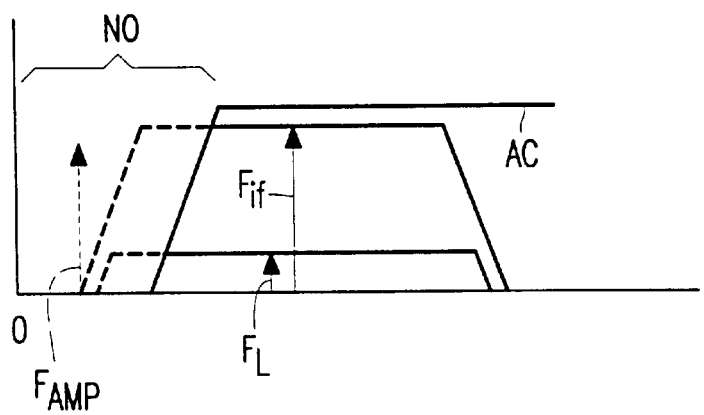
Figure 8:
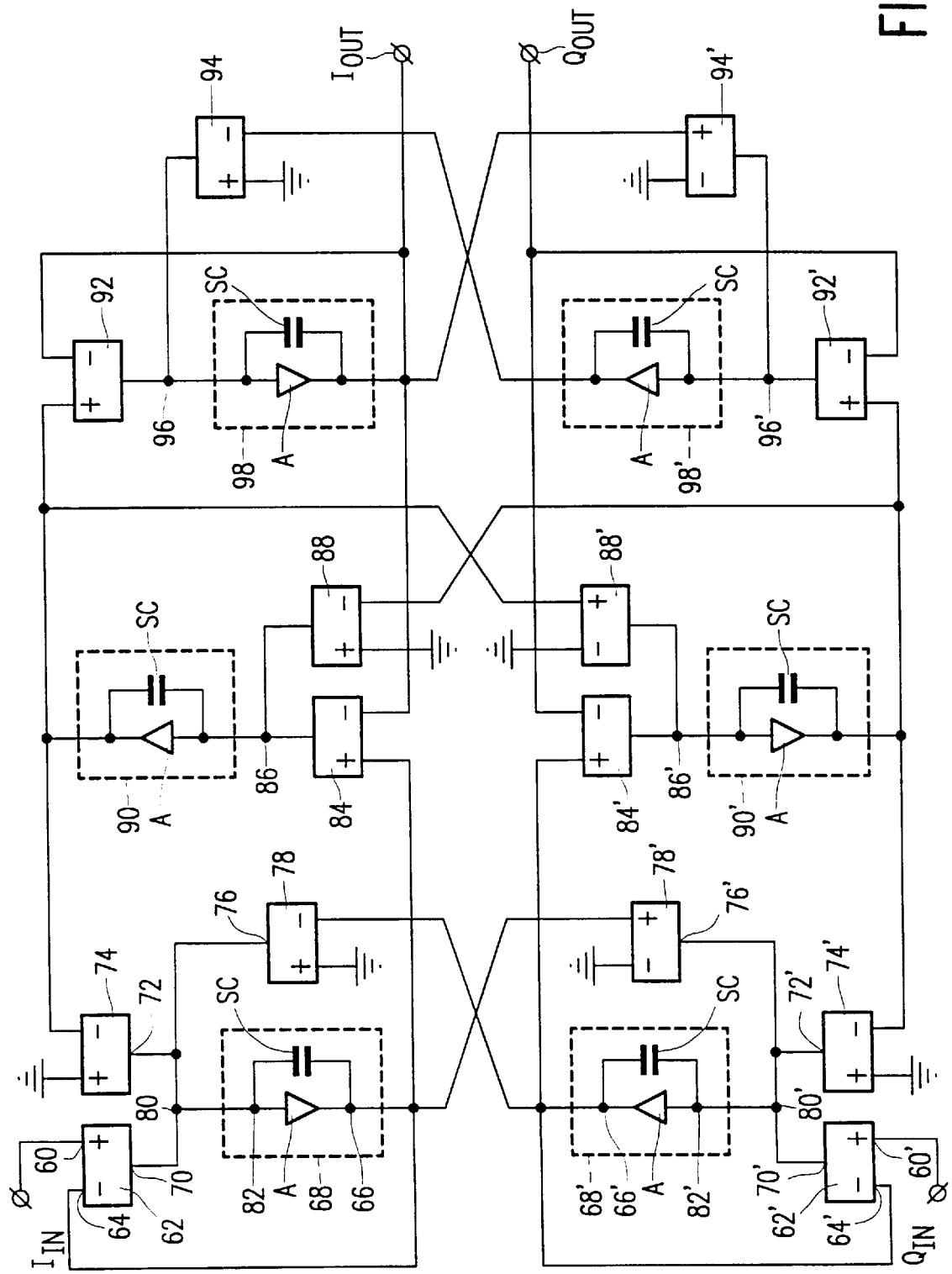

FIG. 3 is a block schematic diagram of one embodiment of an integrated receiver made in accordance with the present invention, FIG. 4 illustrates a known symmetrical polyphase filter, FIG. 5 illustrates another known symmetrical polyphase filter fabricated using gyrators, FIG. 6 is a block schematic diagram of another embodiment of an integrated receiver made in accordance with the present invention, and FIGS. 7A and 7B are waveform diagrams explaining the operation of the circuit shown in FIG. 6, and FIG. 8 is a block schematic diagram of transconductor integrator filters.

In the drawings the same reference numerals have been used to indicate corresponding features.

For convenience of description the present invention will be described with reference to the GSM digital cellular telephone system.

Figure 1:
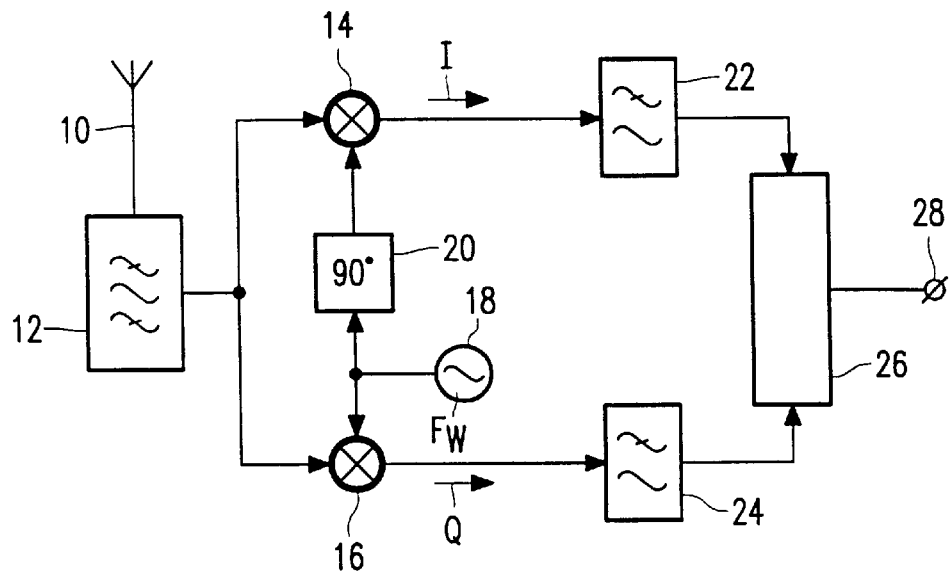
FIG. 1 is a block schematic diagram of a basic direct conversion ZIF receiver.

The zero i.f receiver shown in FIG. 1 comprises an antenna 10 which is coupled to an rf bandpass filter 12 which selects the band of frequencies of interest. The output from the bandpass filter 12 is split into two paths I, Q, each of which has a mixer 14, 16. First inputs of the mixers 14, 16 are coupled to the output of the bandpass filter 12. The second inputs of the mixers 14, 16 are provided by a local oscillator signal from an oscillator 18. The local oscillator signal supplied to the mixer 14 is phase shifted by approximately 90° relative to that applied to the mixer 16 by means of a 90° phase shifter 20. The products of mixing are applied to respective low pass filters 22, 24, the outputs of which are supplied to a demodulator 26 which provides the wanted signal as an output on a terminal 28.

The operation of this type of receiver is well known. The local oscillator frequency corresponds approximately to the nominal carrier frequency of the signal received at the antenna 10 and this causes the input signal to be frequency down converted to substantially ZIF.

As mentioned in the preamble one problem with the basic receiver shown in FIG. 1 is that of dc offsets. If ac coupling is provided between the mixers 14, 16 and their respective low pass filters 22, 24, then a notch will be created. As was explained if the ac coupling is done by way of capacitors then the width of the notch can be reduced by using high value capacitors but this has the disadvantage of making the receiver circuit slow to respond and also there is a difficulty in integrating high value capacitors. The alternative of using low value capacitors brings the benefits of making the capacitors integratable and speeding up of the circuit but creates a relatively wide notch.

Figure 2A:
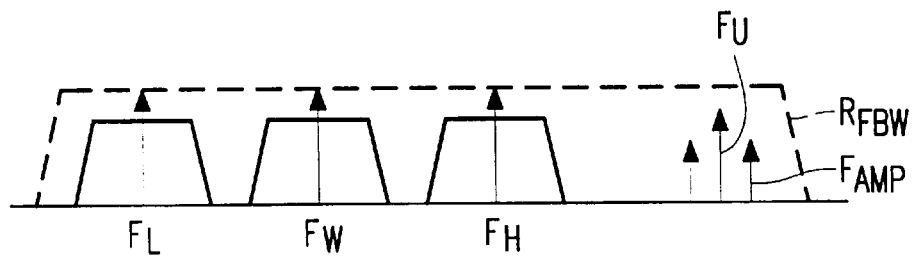
FIG. 2A shows the signal received at the antenna.
Figure 2B:
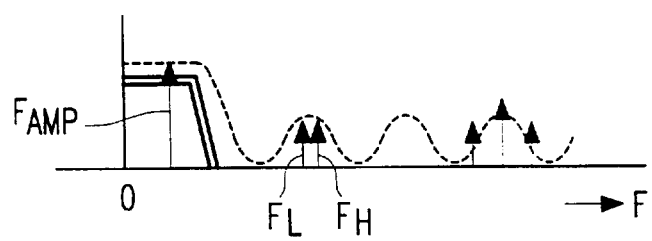
FIG. 2B shows the signal at the output of the mixers.

Another problem of this type of receiver arises if the wanted signal bandwidth is relatively close to an interfering source comprising a strong amplitude modulated signal. This is illustrated in FIG. 2A which shows in broken lines the rf bandwidth RFBW of the bandpass filter 12. Within the bandwidth RFBW lies the wanted signal which is a frequency modulated signal, symmetrically disposed about a nominal carrier frequency $F_W$, upper and lower adjacent channels centred on nominal carrier frequencies $F_H$ and $F_L$, respectively, and a strong amplitude modulated signal comprising a carrier $F_U$ and sidebands referenced $F_{AMP}$. FIG. 2B shows the result of frequency down conversion in the mixers 14, 16 using a local oscillator frequency at or about $F_W$, the signal components below $F_W$ are folded about zero frequency so that the higher and lower frequency halves of the wanted signal overlie each other, the higher and lower adjacent channels $F_H$ and $F_L$ are superposed on one another and, as a result of direct detection, the amplitude modulated component $F_{AMP}$ of the unwanted signal lies within the bandwidth of the wanted signal. The unwanted signal $F_{AMP}$ cannot be removed by channel filtering without affecting the wanted signal because it is lying within the bandwidth of the wanted signal.

One method of alleviating this problem is to move the wanted i.f. band of frequencies away from ZIF and to make it higher than that of the directly detected interferer $F_{AMP}$. If this is done then a high pass filter can be used to separate the wanted signal from the unwanted signal. However a high pass filter is effectively equivalent to using a low value capacitor to provide ac coupling which in turn leads to the creation of a wide notch which would lead to the creation of an unwanted image response which would need to be suppressed.

Two possible methods of providing this image suppression are the use of a phasing or a polyphase receiver.

FIG. 3 illustrates a phasing receiver in which the local oscillator signal is selected to provide an intermediate frequency which is higher than, and separate from, the unwanted interferer $F_{AMP}$. The i.f. has a value, for example half the channel spacing, such that the receiver can be fabricated as an integrated receiver.

The phasing receiver comprises an antenna 10 which is connected to a bandpass filter 12 the output of which is connected to first inputs of frequency down converting mixers 14, 16. A local oscillator 18 having a frequency which is offset from the nominal carrier of the wanted signal $(F_W+F_{if})$ is supplied directly to the second input of the mixer 16 and by way of a 90° phase shifter 20 to the second input of the mixer 14. High pass filters 23, 25 are coupled to the outputs of the mixers 14, 16, respectively. Phase shifting devices 30, 32 are connected to outputs of the high pass filters 23, 25. The relative phase shift between the phase shifters 30, 32 is approximately 90° but otherwise the actual phase shifts introduced are arbitrary. The outputs of the phase shifters 30, 32 are applied to respective inputs of a summing (or differencing) stage 34 in order to recover the wanted signal which is applied to bandpass filter 36.

As mentioned, the use of high pass filters 23, 25 creates a relatively large notch NO which, as shown in FIG. 7B, distorts the lower frequency end of the wanted band of frequencies. In order to overcome the distortion introduced by the high pass filters together with any other distortion in the signal channel between the transmitter and the antenna 10, an equaliser 52 is coupled to the output of the stage 34. The equaliser 52 may be any suitable type of equaliser such as a Viterbi equaliser or decision feedback equaliser. The filter coefficients of the equaliser 52 are trained using a signal which is suitable for use as a training signal. In the case of GSM, the signal includes a receiver training sequence.

In order for the phasing receiver to be effective sufficient image suppression will need to be achieved. This requires that the mixers 14, 16 should be identical, the phase shift introduced by the phase shifter 20 and the relative phase shift between the phase shifters 30, 32 should each be 90° and lastly the stage 34 should provide perfect addition or subtraction. Even with integrated circuits this cannot be guaranteed. In reality signals are of a complex mathematical nature but the circuit shown in FIG. 3 processes the real and imaginary parts of these signals as if they were two separate real signals. In order to be able to deal with complex signals more effectively it is possible for the filters 23, 25, phase shifters 30, 32 and the summing stage 34 to be replaced by a polyphase filter.

Polyphase filters are known per se and FIG. 4 illustrates a known symmetrical polyphase filter which is disclosed for example in FIG. 3 of British Patent Specification 1174710. The illustrated polyphase filter comprises a four phase network section and each phase comprises a resistor R connected between an input terminal and an output terminal of a phase of which it is associated. A capacitor C couples an input of each phase to the output of an adjacent leading phase. As shown the input voltages $V_1$, $jV_1$, $-V_1$, $jV_1$ and currents $I_1$, $jI_1$, $-I_1$, $-jI_1$ are of a complex nature as are the output voltages $V_2$, $jV_2$, $-V_2$, $-jV_2$ and currents $I_2$, $jI_2$, $-I_2$, $-jI_2$.

FIG. 5 illustrates another known symmetrical polyphase filter 50 fabricated using gyrators. This type of polyphase filter is disclosed in a PhD thesis by J. O. Voorman "The Gyrator as a Monolithic Circuit in Electronic Systems" Catholic University of Nijmegen, The Netherlands, Jun. 16th 1977, Pages 91 to 103. The illustrated polyphase filter comprises third order LC channel filters 40, 42 implemented using gyrators and each of the stages of the filter are crosslinked by gyrators 44, 46 and 48. The filter 40 could be in the I path and the filter 42 in the Q path. The LC filter comprises capacitors C10, C12 and an inductance which is simulated by a capacitance C11 and gyrators G10 and G12. The filter 42 is of identical construction and will not be described.

FIG. 6 illustrates an integrated polyphase receiver having the same front end as the receiver shown in FIG. 3 and in the interests of brevity it will not be described again. The outputs of the mixers 14, 16 are coupled by respective capacitors 54, 56 to inputs of a polyphase filter 50. Outputs from the polyphase filter 50 are coupled to an equaliser and detector 52 to reduce or eliminate distortion which has occurred and to recover the wanted signals.

In FIG. 6 $F_{if}$ is passed by the polyphase filter 50 but $-F_{if}$ is blocked more effectively than would be the case in a phasing receiver. The value of $F_{if}$ is selected to be half the channel spacing. Thus in the case of GSM where the channel spacing is 200 kHz, $F_{if}$ is 100 kHz.

FIG. 7A illustrates diagrammatically the outputs of each of the mixers 14,16. The directly detected AM interferer $F_{AMP}$ is at or adjacent to the lower frequency end of the band of wanted signals which is generally symmetrical about $F_{if}$. Also shown are the higher and lower adjacent channels centred on nominal carrier frequencies $F_H$ and $F_L$ for the case of choosing $F_{if}$ as half the channel spacing. S represents the degree of image suppression by the polyphase filter.

FIG. 7B illustrates the effect of the ac-coupling (curve AC) using a low value of capacitance which produces a notch NO of sufficient width that it distorts the lower frequency half of the band of wanted signals and substantially eliminates $F_{AMP}$. The lower the value of the capacitors 54, 56, the wider the notch NO which is created which in turn leads to a greater distortion of the wanted signal band. By coupling the equaliser 52 to the output of the polyphase filter 50 then the effects of the distortion introduced by the ac coupling capacitors 54, 56 can be substantially alleviated because the equaliser 52 endeavours to equalise the received signal in respect of all the sources of distortion and not only that which occurs due to the signal channel between the transmitting and receiving antennas. Thus the output from the equaliser 52 comprises a substantially undistorted, interference free signal. In the case of GSM, the signal transmitted by a base station includes a training sequence which can be used to train the equaliser coefficients in response to the multipath effects between the transmitting and receiving antennas together with the distortion introduced by the ac coupling capacitors 54, 56. The equaliser 52 may comprise any suitable equaliser such as a Viterbi or a decision feedback equaliser.

FIG. 8 illustrates the polyphase filtering means being implemented as third order transconductor integrator filtering means. The in-phase I and quadrature phase Q sections are substantially identical apart from the polarity of the input signals to some of the transconductors.

For convenience of description the in-phase I section will be described in detail and primed reference numerals will be used to indicate the corresponding parts in the quadrature-phase Q section. The input signal $I_{IN}$ ($Q_{IN}$) is applied to a non-inverting input 60 (60') of a transconductor 62 (62'). An inverting input 64 of the transconductor 62 is provided with a signal fedback from an output 66 of an integrator 68. An output 70 of the transconductor 62 together with outputs 72, 76 of transconductors 74, 78, respectively, are summed at a node 80 and the sum signal is applied to an input 82 of the integrator 68. In FIG. 8 each of the integrators comprises a op-amp A with a shunt capacitor SC.

The output 66 of the integrator 68 is coupled to non-inverting inputs of transconductors 78' and 84 and to the inverting input 64 of the transconductor 62. The inverting input of the transconductor 78' is connected to ground. The output 66' of the integrator 68' is coupled to the inverting input of the transconductor 64' and 78, and to the non-inverting input of the transconductor 84'. The non-inverting input of the transconductor 78 is connected to ground.

The output of the transconductor 84 is coupled to a summing node 86 to which an output of another transconductor 88 is connected. The summing node 86 is coupled to an integrator 90, the output of which is coupled to an inverting input of the transconductor 74 and to non-inverting inputs of transconductors 88' and 92. The output of the integrator 90' is coupled to the inverting inputs of the transconductors 74' and 88 and to the non-inverting input of the transconductor 92'. The non-inverting inputs of the transconductors 74, 74' are connected to ground as are the non-inverting and inverting inputs of the transconductors 88, 88', respectively.

Outputs of transconductors 92, 94 are coupled to a node 96 which is coupled to the input of an integrator 98. An output of the integrator 98 is coupled to the non-inverting inputs of the transconductors 84 and 92 and to the non-inverting input of a transconductor 94'. An output of the integrator 98' is coupled to the inverting inputs of the transconductors 84', 92' and 94. The non-inverting and inverting inputs of the transconductors 94, 94', respectively, are connected to ground. The outputs $I_{OUT}$ and $O_{OUT}$ are also derived from the outputs of the integrators 98, 98', respectively.

If desired the transconductor integrator filters may have counterparts in switched capacitor, switched current and related digital implementations.

From reading the present disclosure, other modifications will be apparent to persons skilled in the art. Such modifications may involve other features which are already known in the design, manufacture and use of integrated receivers and component parts thereof and which may be used instead of or in addition to features already described herein. Although claims have been formulated in this application to particular combinations of features, it should be understood that the scope of the disclosure of the present application also includes any novel feature or any novel combination of features disclosed herein either explicitly or implicitly or any generalisation thereof, whether or not it relates to the same invention as presently claimed in any claim and whether or not it mitigates any or all of the same technical problems as does the present invention. The applicants hereby give notice that new claims may be formulated to such features and/or combinations of such features during the prosecution of the present application or of any further application derived therefrom.

We claim:

1. A receiver for receiving signals comprising:
    a converter which directly converts said signals having wanted signals and interfering signals to quadrature signals using a local oscillating signal having an oscillating frequency which is offset from a carrier frequency of said signals by an intermediate frequency, said quadrature signals having a frequency which equals said intermediate frequency, wherein said intermediate frequency is half a channel spacing and places said interfering signals in a vicinity of one end of a bandwidth of said wanted signals;

a filter which removes said interfering signals and a portion of said wanted signals near said interfering signals from said quadrature signals and outputs filtered quadrature signals which have distortions introduced by said filter; and an equalizer which equalizes the distortions of the filtered quadrature signals and detects modulated signals present in said filtered quadrature signals to reconstruct said wanted signals.

2. The receiver of claim 1, wherein said intermediate frequency is higher than the frequency of said interfering signals.

3. The receiver of claim 1, wherein said equalizer overcomes distortions occurring in a path of said received signal from a point where said received signal leaves a transmitter and reaches said equalizer.

4. The receiver of claim 1, wherein said equalizer is trained using a training sequence received by said receiver to remove the distortions introduced by said filter and multipath distortions occurring between a transmitter and said receiver.

5. The receiver of claim 1, wherein said receiver is a phasing receiver.

6. The receiver of claim 1, wherein said receiver is a polyphase receiver.

7. The receiver of claim 1, wherein said filter comprises polyphase filtering means, said receiver including dc blocking means which comprises ac coupling means for coupling the quadrature signals to said polyphase filtering means.

8. The receiver of claim 7, wherein said polyphase filtering means comprises gyrator filtering means.

9. The receiver of claim 7, wherein said polyphase filtering means comprises transconductor integrator filtering means.

10. The receiver of claim 1, wherein said equalizer comprises Viterbi equalizing means.

* * * * *